(12) United States Patent
Sakai et al.

(10) Patent No.: US 6,536,105 B1
(45) Date of Patent: Mar. 25, 2003

(54) METHOD FOR MOUNTING CONDUCTIVE BALLS ON A SUBSTRATE

(75) Inventors: Tadahiko Sakai, Fukuoka (JP); Shoji Sakemi, Fukuoka (JP); Kazuhiro Noda, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/525,948

(22) Filed: Mar. 15, 2000

(30) Foreign Application Priority Data

| Mar. 16, 1999 | (JP) | ........................... 11-069772 |
| Mar. 16, 1999 | (JP) | ........................... 11-069774 |
| Mar. 24, 1999 | (JP) | ........................... 11-079119 |

(51) Int. Cl.⁷ ............................................. H01R 9/00
(52) U.S. Cl. ..................... 29/843; 29/832; 29/729; 29/840; 29/860
(58) Field of Search ................ 29/743, 843, 840, 29/860, 729, 833, 832, 854, 714, 720, 721, 705, 741; 356/394; 228/41

(56) References Cited

U.S. PATENT DOCUMENTS

| 5,172,468 A | * 12/1992 | Tanaka et al. ................. 29/721 |
| 5,186,719 A | * 2/1993 | Egashira et al. ............. 228/4.5 |
| 5,657,528 A | * 8/1997 | Sakemi et al. ............... 228/245 |
| 5,758,409 A | * 6/1998 | Nakazato ..................... 228/246 |
| 5,768,775 A | * 6/1998 | Nakazato ..................... 228/245 |
| 5,890,283 A | * 4/1999 | Sakemi et al. ......... 228/180.21 |
| 5,983,490 A | * 11/1999 | Sakemi ......................... 29/743 |
| 6,065,201 A | * 5/2000 | Sakai .......................... 228/245 |
| 6,119,337 A | * 9/2000 | Furuno .................... 29/402.01 |
| 6,352,189 B1 | * 3/2002 | Kobayashi .................. 228/246 |
| 6,364,196 B1 | * 4/2002 | Wood et al. ................... 228/41 |
| 6,389,683 B1 | * 5/2002 | Mori et al. ..................... 29/740 |
| 6,390,351 B1 | * 5/2002 | Kasai et al. ................ 228/246 |

* cited by examiner

Primary Examiner—Timothy V. Eley
Assistant Examiner—David Nguyen
(74) Attorney, Agent, or Firm—McDermott, Will & Emery

(57) ABSTRACT

A conductive ball mounting equipment for mounting conductive balls on electrodes of a plurality of electronic components formed on a substrate, including a suction tool having a suction face to cover each one of divided blocks on the substrate, a suction part which is formed on the suction face of the suction tool, corresponding to the arrangement pitches of the electronic components and sucks the conductive balls to the positions corresponding to the electrodes, and a suction limiter for sucking the conductive balls only to the specified suction part corresponding to the electronic components in the divided blocks. According to this construction, the conductive balls can be efficiently and stably mounted on the electrodes of the electronic components of the substrate.

16 Claims, 13 Drawing Sheets

FIG. 6A
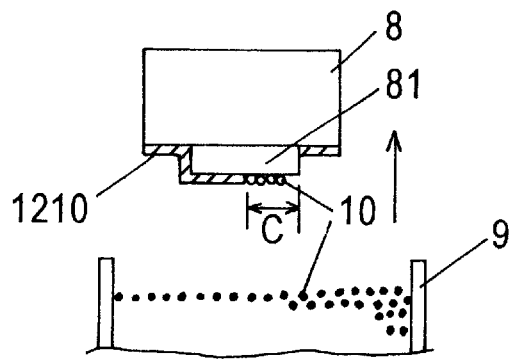
FIG. 6B
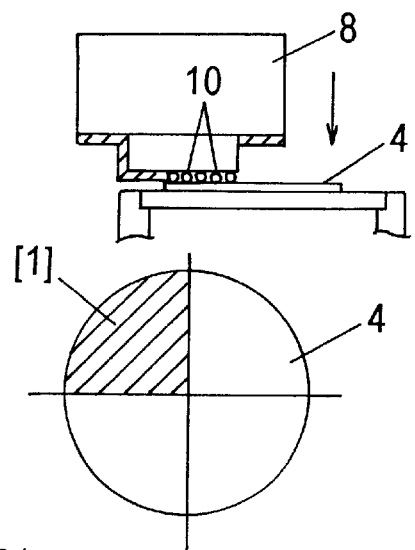
FIG. 6C
FIG. 6D
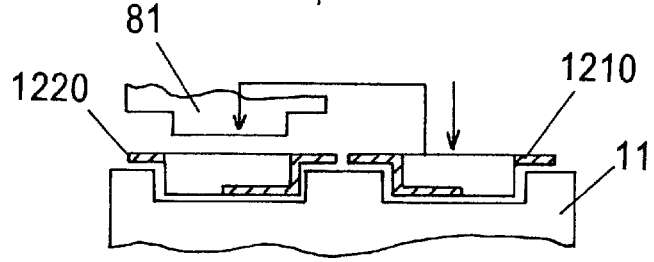
FIG. 6E
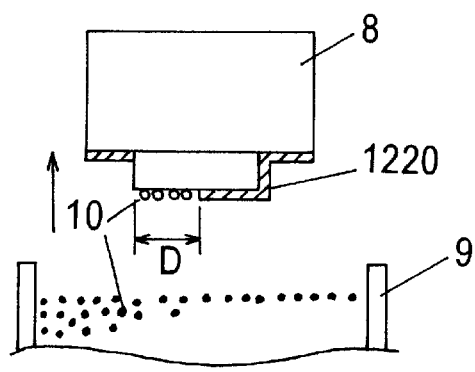

METHOD FOR MOUNTING CONDUCTIVE BALLS ON A SUBSTRATE

FIELDS OF THE INVENTION

The present invention relates to a mounting equipment and mounting method of conductive balls for mounting conductive balls on the electrodes of a plurality of electronic components, for example semiconductor elements, formed on a substrate.

BACKGROUND OF THE INVENTION

In a process forming a bump, which is an extruded electrode, on an electronic component, conductive balls such as solder balls are mounted on the electrodes of the electronic component. Mounting conductive balls has been processed at a wafer state before the electronic component is cut into pieces, in other words at a state in which a lot of semiconductor elements of electronic components is still formed on a substrate in a lattice arrangement.

In the case in which conductor balls are directly mounted on a wafer, however, there is a following problem in a prior art. That is, a wafer is round and when electronic components of rectangular pieces must be cut out from the round wafer, the cut-out line does not coincide with the periphery of the wafer. Accordingly, near the periphery of the wafer, the cut-out line becomes an irregular stair shape. As a result, when conductive balls are mounted on each electronic component of the wafer, a plurality of electronic components can not be gathered together as a rectangular block with good unity and it has to select either to mount piece by piece or to mount altogether for the entire wafer.

In the case of mounting piece by piece, because a lot of mounting actions must be repeated, the productivity decreases. In the case of mounting altogether, there is a difficulty in reliability to secure the correct mounting. In a prior art, it is difficult to mount balls efficiently and stably when balls are directly mounted on a wafer, as explained above.

SUMMARY OF THE INVENTION

The present invention is to address this problem and aims to offer a mounting equipment and a mounting method of conductive balls, which can efficiently and stably mount conductive balls on electrodes of a plurality of electronic components formed on a substrate.

A mounting equipment of conductive balls of the present invention is a conductive ball mounting equipment for mounting conductive balls on electrodes of a plurality of electronic components formed on a substrate and comprises:

(a) a suction tool having a suction face covering each divided block of a substrate divided into a plurality of blocks;

(b) a suction part formed on the suction face of the suction tool for sucking conductive balls to the positions corresponding to the electrodes and the arrangement pitch of the electronic components; and (c) suction limiter for sucking the conductive balls, limiting only to the suction part corresponding to the electronic components in the divided blocks.

The above construction enables conductive balls to be sucked only to the suction part determined by a suction limiter, and to be mounted on a pre-divided block with one action. As a result, balls can be efficiently and stably mounted on a substrate with a specified area where conductive balls are not needed using a single suction tool.

Another conductive ball mounting equipment of the present invention has a following construction.

It is a conductive ball mounting equipment in which conductive balls e vacuum-sucked picked up by a suction tool and mounted on a workpiece. The pick-up head is provided with a fine suction hole blocker for partially and controllably blocking a part of fine suction holes to match with a designated ball-mounting area.

By this construction, efficiency and stability upon mounting conductive balls on a substrate with a designated area for balls not to be mounted can be achieved.

Another conductive ball mounting equipment of the present invention has a construction described below.

It is a conductive ball mounting equipment in which conductive balls are vacuum-sucked, picked up by a pick-up head with a plurality of fine suction holes at the bottom, and mounted on a workpiece. The pick-up head is provided with a blockade plate which is detachably attached at an attachment opening at the side face of the pick-up head for partially blocking a plurality of suction tubes according to the ball mounting area.

According to this construction, conductive balls can be stably mounted on different mounting areas by a single pick-up head.

BRIEF DESCRIPTION OF THE DRAWINGS

FIGS. 6A, 6B, 6C, 6D and 6F illustrate a process to mount conductive balls by the same equipment.

DETAILED DESCRIPTION OF THE EXEMPLARY EMBODIMENTS

Figure 1:
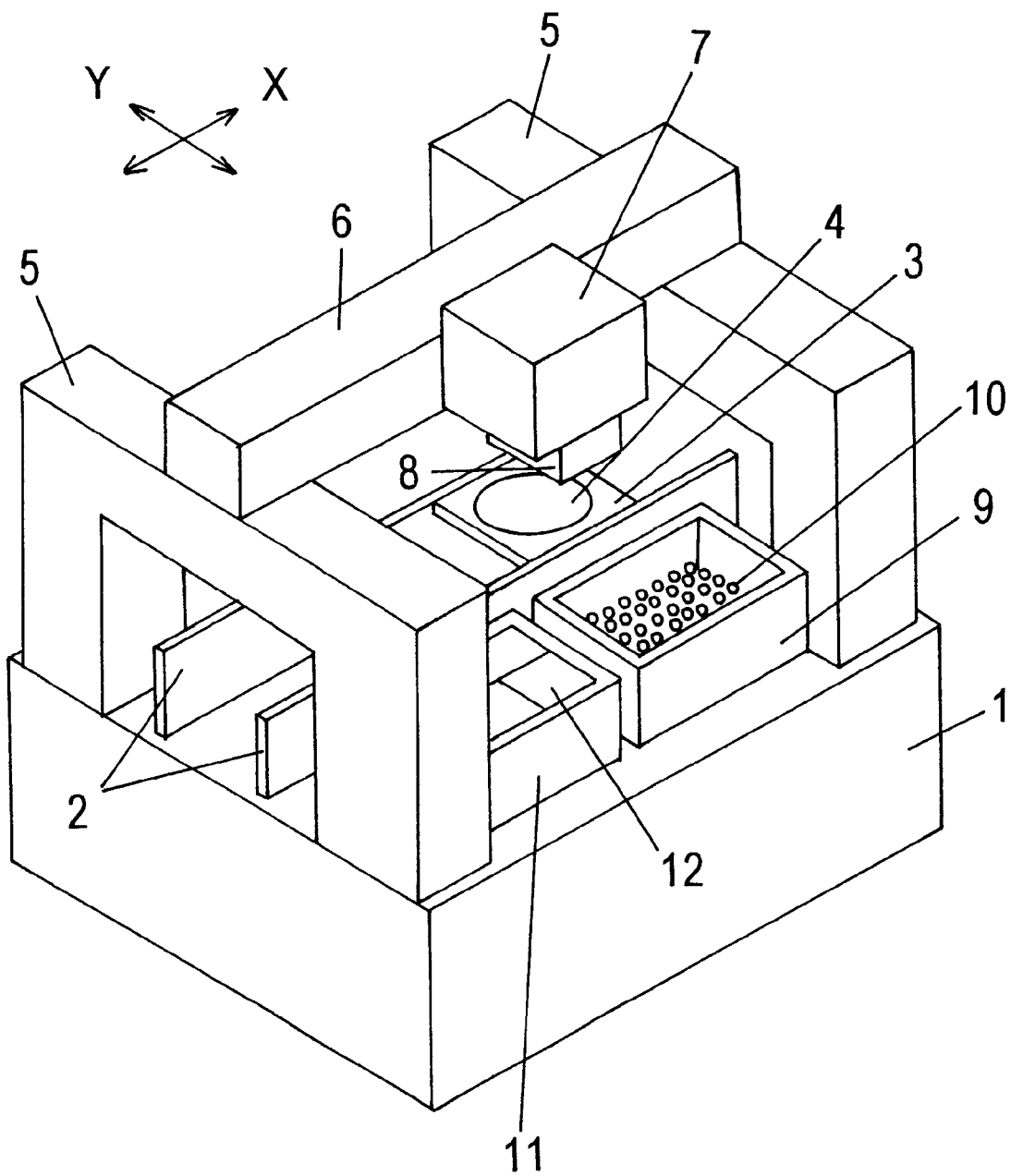
FIG. 1 shows an appearance of a conductive ball mounting equipment in accordance with a first exemplary embodiment of the present invention.

The exemplary embodiments of the present invention are explained below, referring to the drawings.

First Exemplary Embodiment

First, a construction of a conductive ball mounting equipment in accordance with a first exemplary embodiment is explained below, referring to FIG. 1.

In FIG. 1, transfer guide 2 is provided on the center of base stand 1. Transfer guide 2 carries plate 3 holding wafer 4 which is a workpiece, and determines the position of plate 3. Wafer 4 is a nearly circular-shaped substrate, on which a plurality of semiconductors are formed in lattice arrangement. On the both ends of the top face of base stand 1, two pieces of Y-axis table 5 are fixed. X-axis table 6 is installed, bridging between two Y-axis tables 5. On X-axis table 6, mounting head 7 is attached.

Mounting head 7 provides with pick-up head 8 in its bottom part. Mounting head 7 moves on a horizontal plane by driving X-axis table 6 and Y-axis tables 5. Ball supplier 9 is arranged on the side of transfer guide 2. A lot of conductive balls 10 are stored in ball supplier 9. By shifting mounting head 7 to the upper position of ball supplier 9 and vertically shifting pick-up head 8, pick-up head 8 can pick-up conductive balls 10. Then, mounting head 7 shifts to be above pre-positioned wafer 4, where pick-up head 8 shifts down to mount balls 10 on wafer 4.

Mask stocker 11 is arranged at the side of ball supplier 9. In mask stocker 11, mask materials 12 to be attached to pick-up head 8 are stocked. Pick-up head 8 shifts downward to and upward from mask stocker 11, where mask materials 12 can be attached to or detached from pick-up head 8.

Figure 3A:
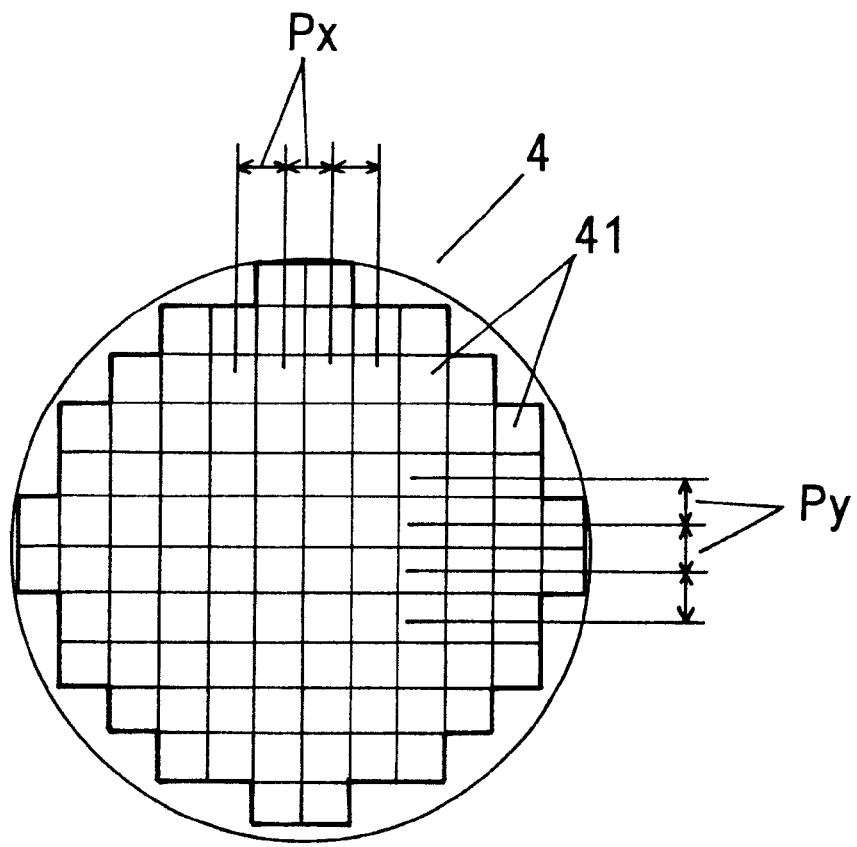
FIG. 3A is a plan view of a wafer on which conductive balls are mounted by the same equipment.
Figure 3B:
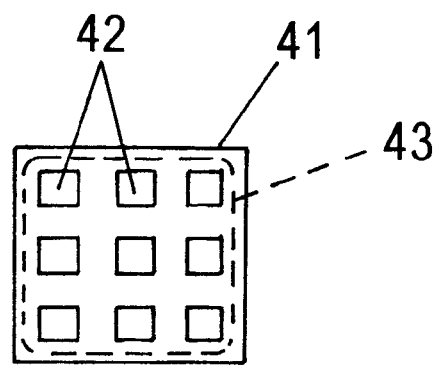
FIG. 3B is a partial plan view of the same.

Wafer 4 is explained below, referring to FIGS. 3A and 3B. Wafer 4 is a substrate having a nearly circular shape as shown in FIG. 3A. A lot of semiconductor elements 41 which are rectangular electronic components are regularly arranged in lattice arrangement with pitches Px and Py. As shown in FIG. 3B, in each semiconductor element 41, electrodes 42 on which conductive balls 10 are to be mounted are formed in a designated arrangement pattern. Electrode group 43 is formed by a plurality of electrodes 42 of a semiconductor element. That is, the area in which these electrode groups 43 are formed is a ball mounting area (an area surrounded by a thick line in FIG. 3A). The outward form of the ball mounting area is stair-shaped.

Pick-up head 8 provided at the bottom of mounting head 7 and suction tool 81 at bottom of pick-up head 8 are explained below, referring to FIGS. 2A and 2B.

Figure 2A:
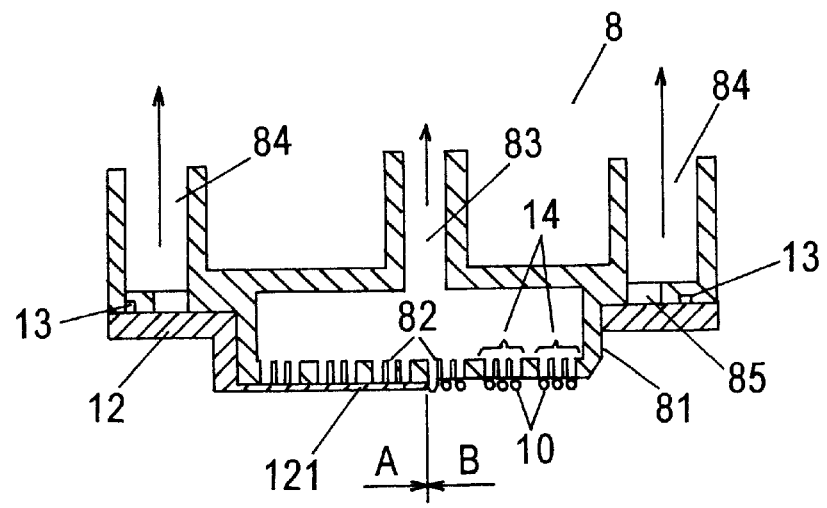
FIG. 2A is a cross section of a pick-up head of the same equipment.

In FIG. 2A, the bottom face of pick-up head 8 is suction tool 81 having a protrusion shape. A lot of fine suction holes 82 are provided on the suction face at the bottom of suction tool 81. Balls 10 are sucked and held to fine suction holes 82 by vacuum-sucking by suction tube 83 provided in suction tool 81.

Figure 2B:
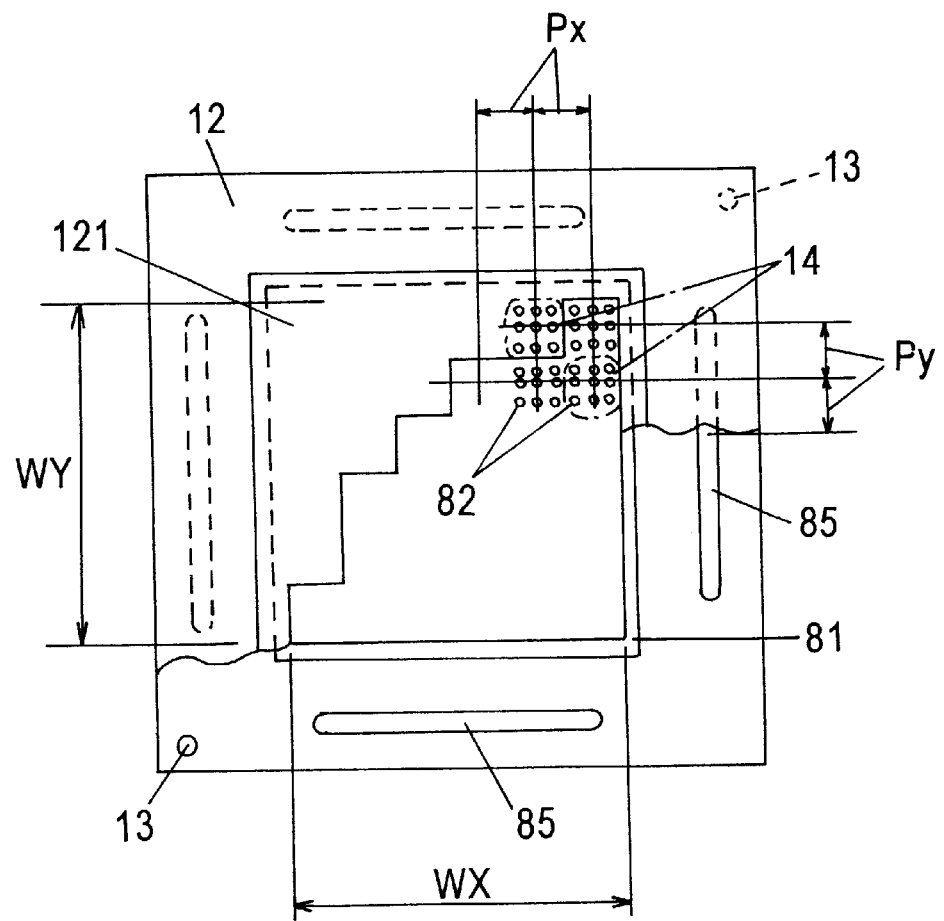
FIG. 2B is a plan view of a bottom of the same pick-up head.

The arrangement of fine suction holes 82 is explained, referring to FIG. 2B. On the suction face of suction tool 81, suction parts 14 which are gatherings of fine suction holes 82, are arranged in lattice arrangement over the entire suction face. This suction face is a plane area smaller than a ball mounting area in the substrate. Each suction part 14 corresponds to each semiconductor element 41. That is, the same number of fine suction holes 82 as electrodes 42 is formed on suction part 14. A plurality of fine suction holes 82 in each suction part 14 are formed at the positions corresponding to the arrangement pattern of electrodes 42 in a semiconductor element. The arrangement pitches of suction part 14 are the same as the arrangement pitches of Px and Py of semiconductor element 41 in wafer 4. Thus, suction parts 14 are formed with the same regularity as the arrangement of semiconductor element 41 and naturally, fine suction holes 82 are also arranged according to the regularity. That is, the arrangement of balls 10 sucked by and held at fine suction holes 82 of each suction part 14 corresponds to the arrangement of electrodes 42 of semiconductor elements 41 of wafer 4.

A division of a ball mounting area when balls are mounted on wafer 4, using suction tool 81 is explained next, referring to FIG. 4A.

There are usually many cases in which the size of wafer 4 is too big for a single suction tool to fill the area with one ball-mounting action. In such a case, a ball mounting area of wafer 4 is divided into a plurality of blocks and balls are mounted respectively on the every divided block.

Figure 4A:
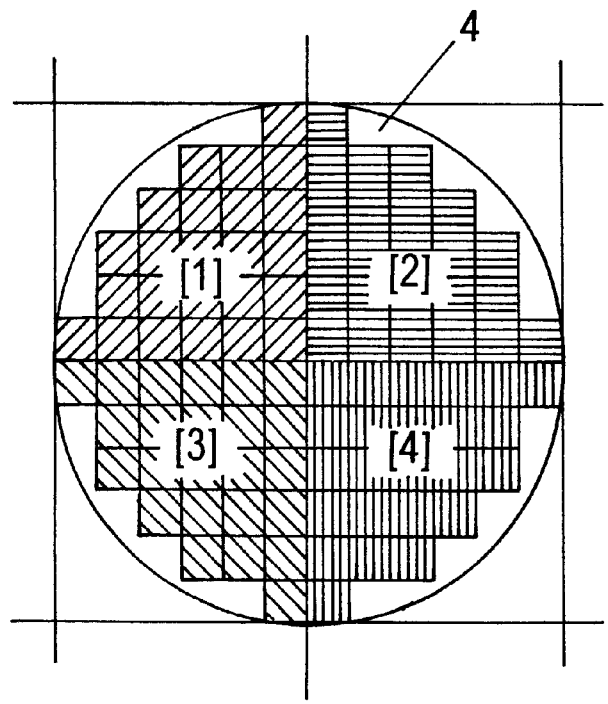
FIG. 4A is a plan view of a wafer on which conductive balls are mounted by the same equipment.

FIG. 4A illustrates an example in which the ball mounting area of wafer 4 is divided into four blocks. In this case, the suction area (size: Wx and Wy) of suction tool 81 shown in FIG. 2B covers each block of blocks [1], [2], [3] and [4]. That is, at dividing the ball mounting area, the divided blocks are set up so that each block is not larger than the size of the suction face of suction tool 81.

Figure 4B:
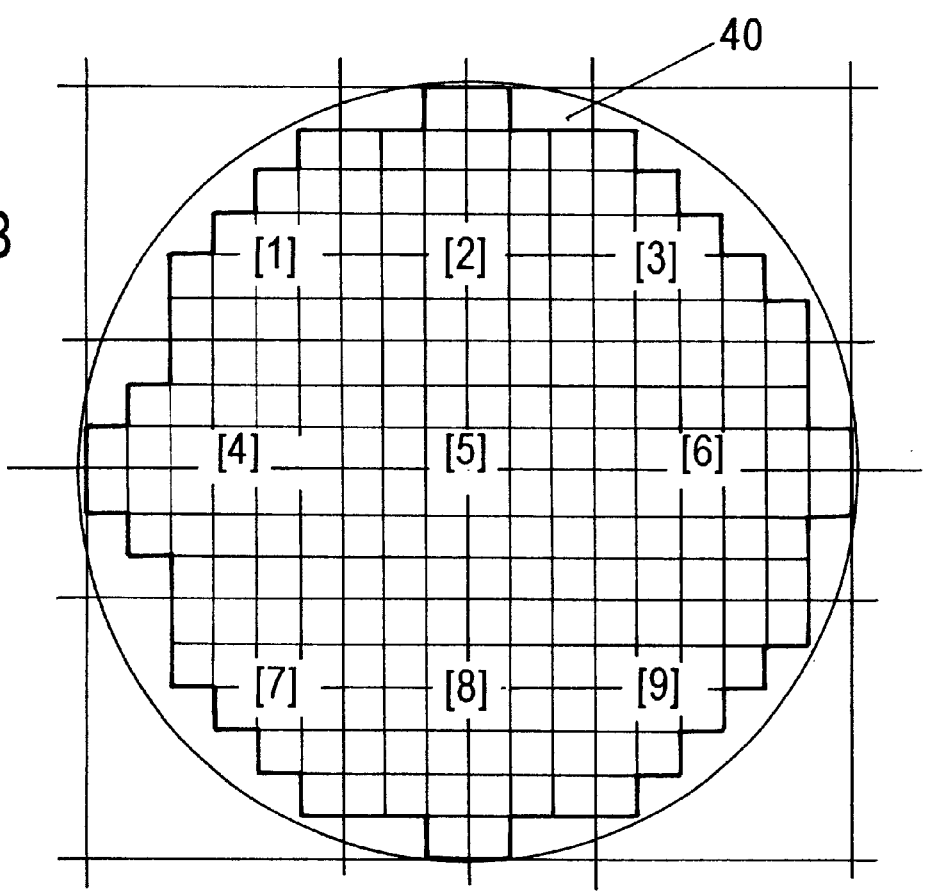
FIG. 4B is a plan view of another wafer on which conductive balls are mounted by the same equipment.

FIG. 4A shows an example in which the ball mounting area is divided into the four nearly same size blocks of [1], [2], [3] and [4], however, the shape and the size of the divided blocks are not necessary to be the same. For example, as shown in FIG. 4B, in the case in which the ball mounting area of wafer 40 which is larger than wafer 4 is divided into 9 blocks of [1] to [9], considering the size of each block can be covered by the suction face of suction tool 81. That is, as long as fine suction holes 82 of the suction face of suction tool 81 has the same pitch and the same electrode arrangement pattern as semiconductor element 41, conductive balls can be mounted on any wafer with different sizes using the same suction tool by changing the arrangement of the divided blocks.

Next, the mask material used upon conductive balls mounting on the different divided blocks with the same suction tool 81 is explained.

Mask material 12 is attached at the bottom of suction tool 81 as shown in FIG. 2A. The shape of mask material 12 is formed so as to fit to a protrusion shape of suction tool 81. Plate part 121 contacting to suction tool 81 has a shape to partially, block suction part 14 from the suction face side of suction tool 81 as shown in FIG. 2B. Balls 10 are sucked only to suction part 14 of area B as shown in FIG. 2A. On the other hand, area A does not suck balls because fine suction holes 82 of suction part 14 are blocked by plate part 121.

Thus, mask material 12 functions as a fine suction hole blocker. Further, mask material 12 functions as a suction limiter for limiting suction part 14 to a specified area for sucking balls 10 by blocking fine suction holes 82 in area A. Mask material 12 is adjusted the position to meet with pick-up head 8 by positioning pin 13. Mask material 12 is detachably attached to pick-up head 8 by vacuum-sucking with suction tube 84 through suction open in 85. Specified fine suction holes 82 can be simply covered by mask material 12 with a simple shape by blocking fine suction holes 82 with the suction face side.

Mask materials 12 are prepared with four different shapes according to the each four divided blocks [1], [2], [3] and [4] shown in FIG. 4A. That is, plate part 121 shown in FIG. 2B is prepared as a mask material for use upon ball mounting to block [1]. Plate material 121 is made so as to suck conductive balls 10 to a specified suction part 14 corresponding to semiconductor element 41 in block [1] of wafer 4. Mask material 1210 for divided block [1] is shown in FIG. 5 as well as 1220, 1230 and 1240 which are used for mounting balls 10 on divided blocks [2],[3] and [4].

Figure 5:
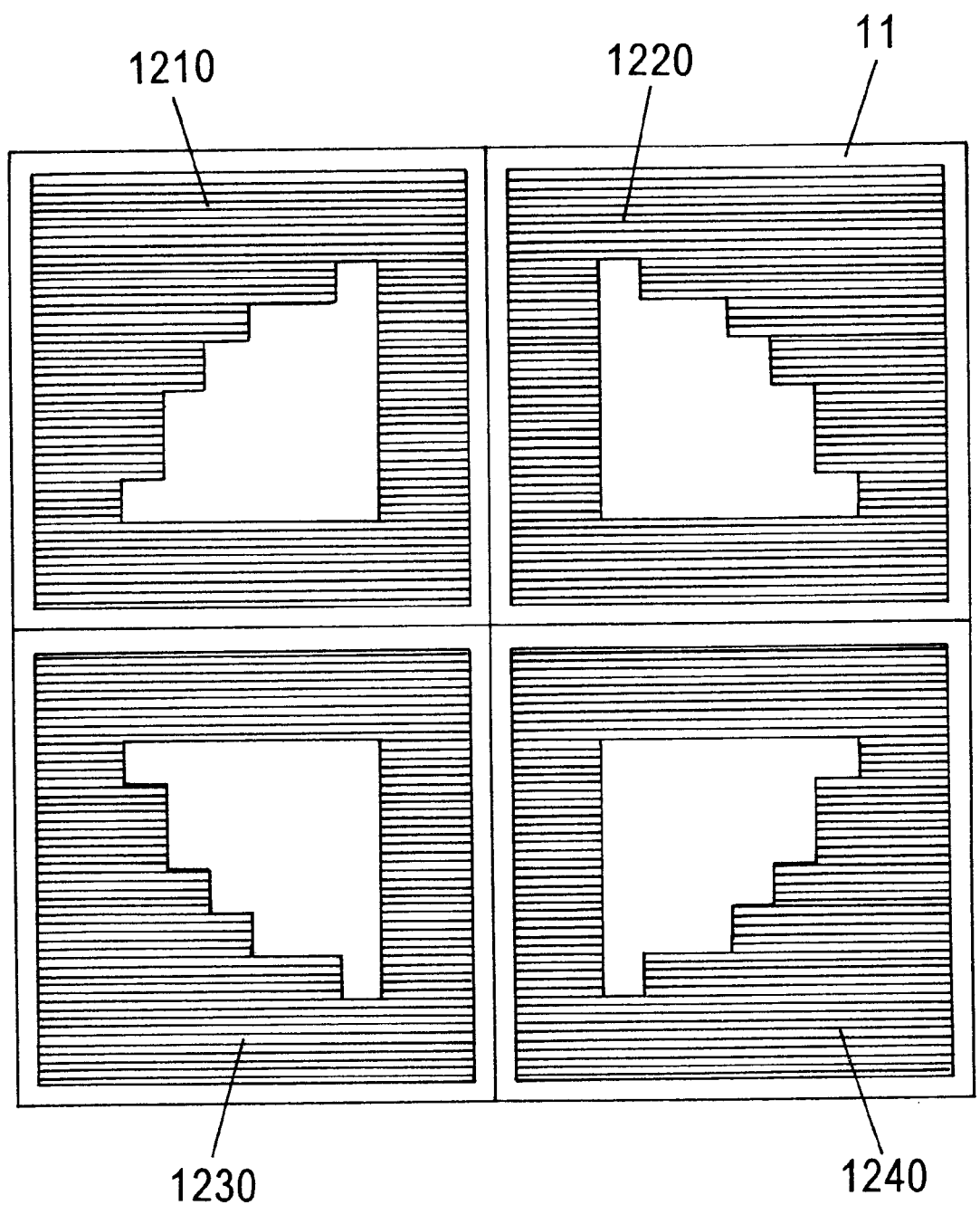
FIG. 5 is a plan view of a mask mounting part of the same equipment.

These four kinds of mask materials 1210, 1220, 1230 and 1240 are arranged on mask stocker 11 as shown in FIG. 5. Pick-up head 8 shifts upward and downward to mask stocker 11, where mounted mask material is detached and any one of other mask materials can be attached for next mounting action.

A conductive ball mounting equipment in the first exemplary embodiment of the present invention is constructed above. A ball mounting method in the first exemplary embodiment is explained below, referring to FIG. 6.

In FIG. 6A, mask material 1210 corresponding to divided block [1] is attached to the bottom face of pick-up head 8. Pick-up head 8 is shifted downwards to conductive balls 10 stocked in ball supplier 9, then suction tool 81 vacuum-sucks conductive balls 10.

In the action, first, fine suction holes 82 for the area except designated area C of suction tool 81 are blocked by mask material 1210 and balls 10 are sucked only to unblocked suction part 14 corresponding to semiconductor elements 41 in divided block [1].

Next, pick-up head 8 is shifted upwards, moved to be above the designated part of wafer 4, then brought downwards where conductive balls 10 are mounted on each electrode (FIG. 3B) of each semiconductor element 41 belonging to divided block [1] of wafer 4.

Then, pick-up head 8 is moved upwards, further shifted towards mask stocker 11, and positioned to be above the designated position of mask stocker 11 where pick-up head 8 is moved to release mask material 1210 to set back to the stocker.

Next, pick-up head 8 is shifted over mask material 1220 which is to be used next and moved downwards to the position, where mask material 1220 corresponding to divided block [2] is sucked and held at the bottom of suction tool 81.

Then, pick-up head 8 is again moved to ball supplier 9 and then shifted downwards, where conductive balls 10 are sucked only to designated area D at the bottom of suction tool 81. The sucked balls 10 are mounted on the electrodes of semiconductor elements 41 belonging to divided block [2] of wafer 4. By repeating the above-mentioned series of actions four times, exchanging mask material 12, conductive balls 10 can be mounted on each electrode of all semiconductor elements 41 of wafer 4. That is, conductive balls 10 can be mounted on a plurality of divided blocks having different shapes by using single suction tool 81.

In this exemplary, the number of trips of mounting head 7 can be only four times to complete the mounting task, which results in achieving good ball-mounting efficiency compared with a conventional ball-by-ball mounting method. In this first exemplary embodiment of the present invention, the equipment cost can be reduced because suction tool 81 which is expensive to make does not need to be exchanged and only mask material 12 which can be made easily at low cost is exchanged. A ball mounting can be stable and has less poor mounting rate because the size of the divided block is designed to be an appropriate size considering the past experiences. In other words, the objective, which has been difficult to realize by a conventional method, realizing both the good mounting efficiency and the stable mounting quality, can be achieved by the method in the present invention.

Figure 7:
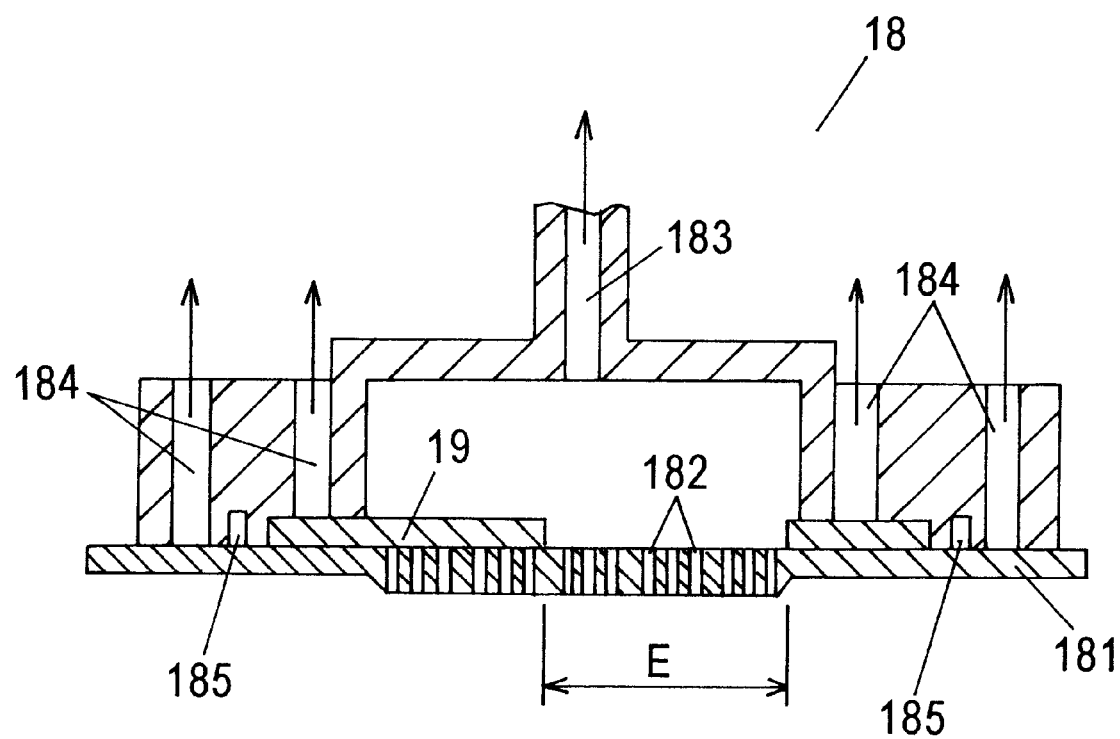
FIG. 7 is a cross section of another pick-up head of the same equipment.

Although the bottom face of suction tool 81, that is mask material 12 sucked to the sucking face side, is used as a blocker for fine suction holes in the first exemplary embodiment, pick-up tool 18 shown in FIG. 7 also can be used. The portion except designated area E among fine suction holes 182 provided at suction tool 181 having a plate shape is blocked by mounting mask plate 19 to block fine suction holes at the top face of suction tool 181, that is at the opposite side of the suction face. Vacuum suction of the balls is done through suction tube 183. Holding of suction tool 181 and mask plate 19 is done by vacuum sucking through other suction tubes 184. Positioning of suction tool 181 is done through positioning pin 185. It is preferable that the suction face of suction tool 181 is always flat to avoid interference between balls already mounted and new balls to be mounted by using pick-up tool 18 in this exemplary.

Second Exemplary Embodiment

A construction of a pick-up head used in a conductive ball mounting equipment in accordance with a second exemplary embodiment of the present invention is explained below, referring to FIGS. 8A and 8B.

A method using vacuum suction as a suction part for sucking and holding conductive balls is used in the first exemplary embodiment. In a second exemplary embodiment, a charged area is provided for sucking conductive balls using a static electricity force to a position corresponding to electrodes of semiconductor elements namely fine suction holes 82 of suction tool 81 in the first exemplary embodiment.

Figure 8A:
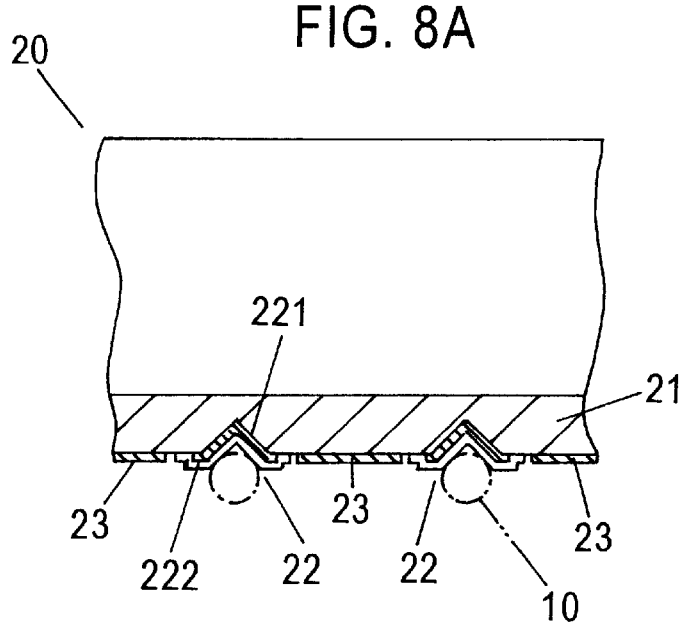
FIG. 8A is a cross section of a pick-up head of a conductive ball mounting equipment in accordance with a second exemplary embodiment of the present invention.
Figure 8B:
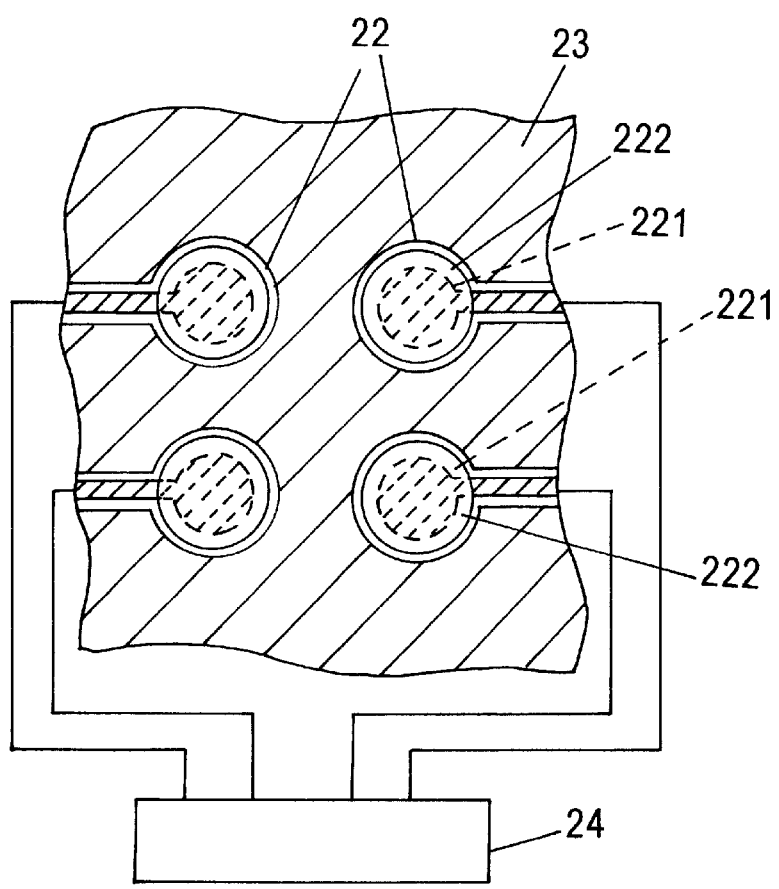
FIG. 8B is a plan view of a bottom face of the same pick-up head.

Suction base plate 21 attached at the bottom face of pick-up head 20 is shown in FIG. 8A. Suction base plate 21 is made of an insulator such as glass or resin, and a plurality of charged area 22 are provided at the bottom face of suction base plate 21. Charged area 22 forms an electric conductor 221 with a good conductivity such as aluminum on a concave inner surface provided on the bottom surface of suction base plate 21, and the surface of charged area 22 is covered with an insulating film 222 such as silicon oxide or polyamide resin. The concave part is formed so as to be able to surely hold one of balls 10 at each charged area 22.

Charged area 22 is formed at a position corresponding to each fine suction hole 82 of suction part 14 in the first exemplary embodiment shown in FIG. 2B. The surface of suction base plate 21 except charged area 22 is covered with conductor 23 similar to conductor 221. Conductor 23 is electrically insulated with conductor 221. Conductor 221 of each charged area 22 is electrically connected to electrification control part 24. Electrification control part 24 controls electrification and electrification release of each charged area 22 by connecting and disconnecting a power supply (not shown) to each conductor 221. In a state in which charged area 22 is charged, conductive ball 10 is held at the concave part by static electricity force. When electrification of charged area 22 is released, the ball held at the concave part is also released from the concave part.

As described, conductive balls 10 can be sucked to a limited suction part 14 corresponding to semiconductor element 41 by controlling electrification, i.e. releasing the electrification of charged area 22 provided at the bottom of pick-up head 20 through electrification control part 24 except the suction part corresponding to semiconductor elements 41 in a divided block of wafer 4 among suction parts 14 shown in FIG. 2B. That is, electrification control part 24 works as a suction limiter.

Third Exemplary Embodiment

Figure 9:
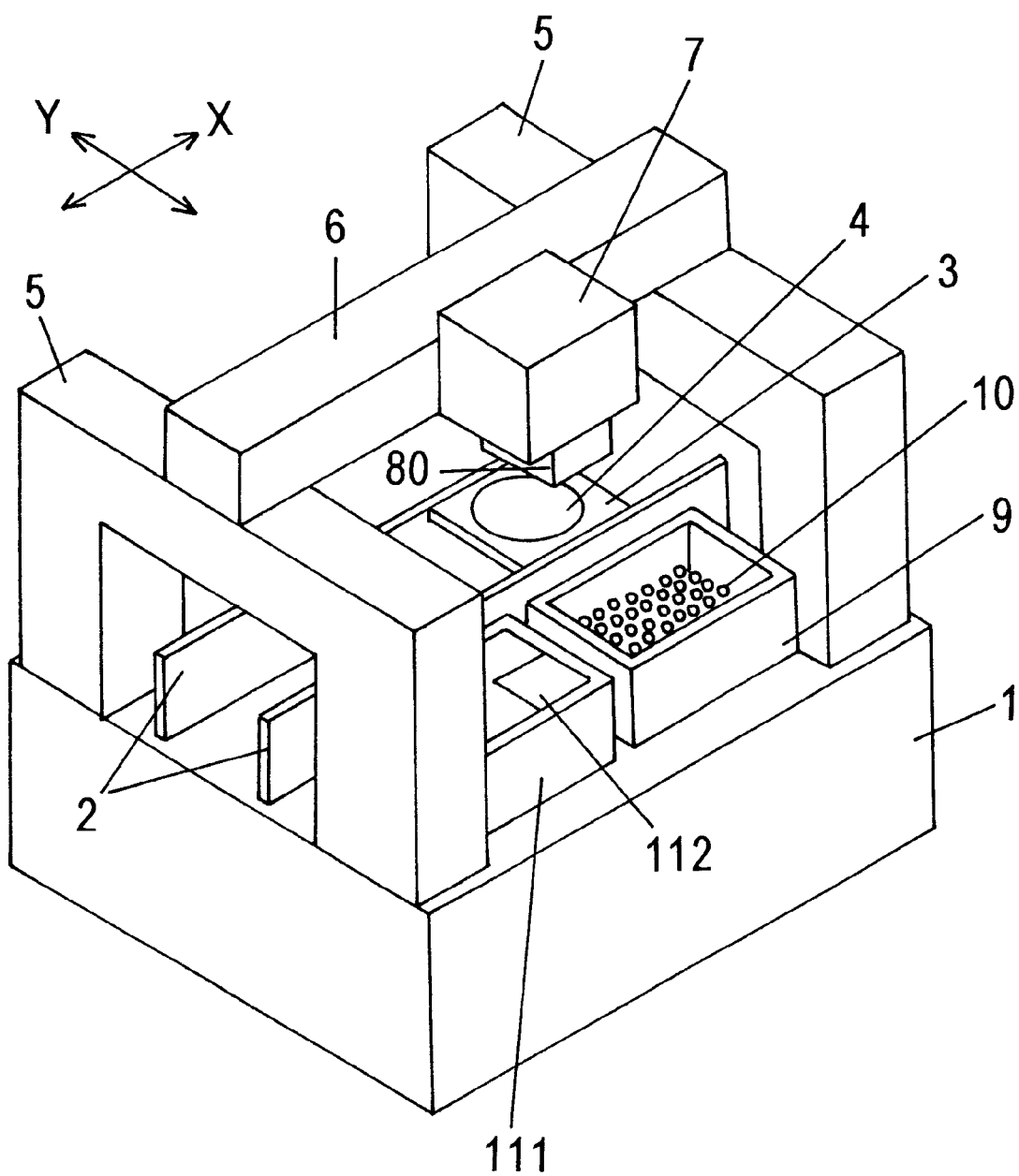
FIG. 9 shows an appearance of a conductive ball mounting equipment in accordance with a third exemplary embodiment of the present invention.

A construction of a conductive ball mounting equipment in accordance with a third exemplary embodiment of the present invention is explained below, referring to FIG. 9. In FIG. 9, the parts having the same functions as those shown in FIG. 1 are numbered with the same references.

In FIG. 9, transfer guide 2 is provided at the center of a base stand 1. Transfer guide 2 transfers plate 3 holding wafer 4 and decides its position. Wafer 4 is a nearly circular-shaped substrate, on which a plurality of semiconductor elements are formed in lattice arrangement. Two Y-axis tables 5 are arranged at both ends on base stand 1. X-axis table 6 is installed, bridging between two Y-axis tables 5 and mounting head 7 is attached to X-axis table 6.

Mounting head 7 is provided with pick-up head 80 at the bottom of it. Mounting head 7 is horizontally shifted by driving X-axis table 6 and Y-axis tables 5. Ball supplier 9 is arranged at the side of transfer guide 2. A lot of conductive balls 10 are stocked in ball supplier 9. Pick-up head 80 picks up balls 10 cooperated with the motion of mounting head 7, which moves over ball supplier 9 and shifts downwards and then upwards. Mounting head 7, then, shifts over pre-positioned wafer 4, where pick-up head 80 is moved downwards to mount balls 10.

Mask stocker 111 is arranged at the side of ball supplier 9. In mask stocker 111, a plurality of mask materials 112 is stocked. Mask material 112 is a blockade plate to be sucked to the bottom face of pick-up head 80. Mask material 112 can be attached to or detached from pick-up head 80 by shifting pick-up head 80 towards mask stocker 111 and fitting it to the designated position.

Pick-up head 80 provided at the bottom of mounting head 7 and suction tool 801 at the bottom face of pick-up head 80 are explained below, referring to FIGS. 10A, 10B and 11.

Figure 10A:
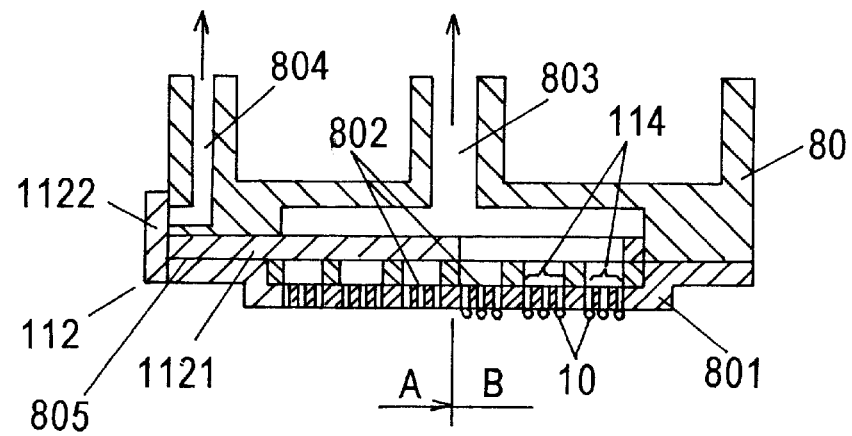
FIG. 10A is a cross section of a pick-up head of the same equipment.
Figure 10B:
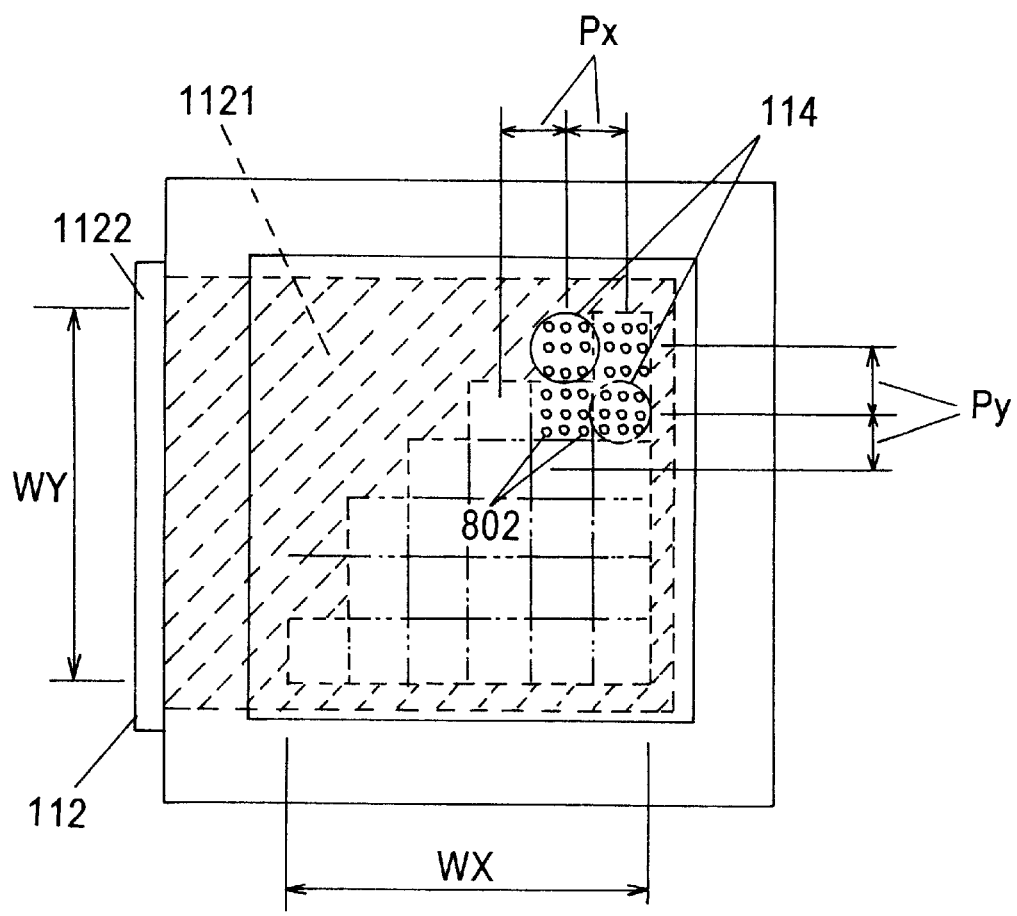
FIG. 10B is a plan view of a bottom of the same pick-up head.

As shown in FIG. 10A, the bottom face of pick-up head 80 is a protrusion-shaped suction tool 801. A lot of fine suction holes 802 are provided at the bottom suction face of suction tool 801. Balls 10 are sucked and held at fine suction holes 802 by vacuum-sucking through suction tube 803.

Figure 11:
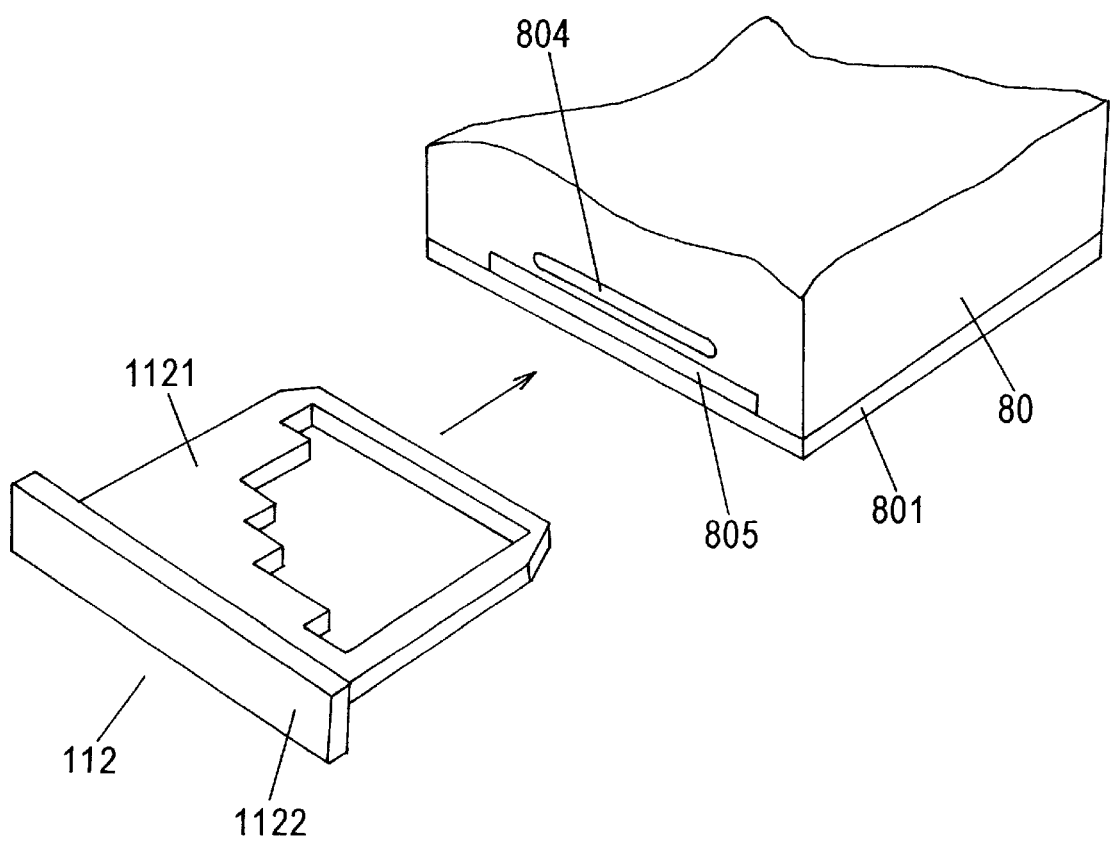
FIG. 11 shows an appearance of the same pick-up head.

As shown in FIG. 11, attachment opening 805 for inserting plate part 1121 of mask material 112 is formed at the side face of pick-up head 80. Plate part 1121 inserted into attachment opening 805 contacts to the top face of suction tool 801 and blocks a partial area of fine suction holes 802. After plate 1121 is inserted, attachment opening 805 is blocked by brim part 1122 of mask material 112. Because of the construction of this exemplary, where attachment opening 805 is provided at the side face of pick-up head 80 and mask material 112 is attached at attachment opening 805, there is no need to remove suction tool 801 from pick-up head 80 when mask material 112 is attached or detached. Mask material 112 can be attached with a comparatively simple construction because a construction to block attachment opening 805 by mask material 112 is adopted.

Next, mask material 112 is explained below. As shown in FIG. 10A, mask material 112 is detachably attached to attachment opening 805 provided at the side face of pick-up head 80 with. Plate part 1121 contacting to the suction face of suction tool 801 has a shape which partially blocks fine suction holes 802 of suction part 114, as shown in FIG.10B.

Balls 10 are sucked only to area B in suction part 114 of suction tool 801, as shown in FIG. 10A. Balls 10 are not sucked to area A because fine suction holes 802 of suction part 114 of area A is blocked by plate part 1121.

As described above, mask material 112 functions as a blocker of fine suction holes. It functions also as a suction limiter to suck balls 10 to the limited suction part 114 of a designated area in a divided block by blocking fine suction holes 802 of the above-mentioned area A. Mask material 112 is sucked and held at pick-up head 80 by being vacuum-sucked through suction tube 804. Suction tube 804 functions as a fixer of mask material 112. Thus, by fixing mask material 112 through suction tube 804, mask material 112 can be stably held also in the case in which the vacuum state is released by giving pressure to the inside of pick-up head 80 through suction tube 803 in order to stop sucking balls 10. As another fixing mechanism, it can be made so as to mechanically push and fix mask material 112 against pick-up head 80 through an actuator such as an air cylinder other than the vacuum-suction mechanism described above.

Figure 12A:
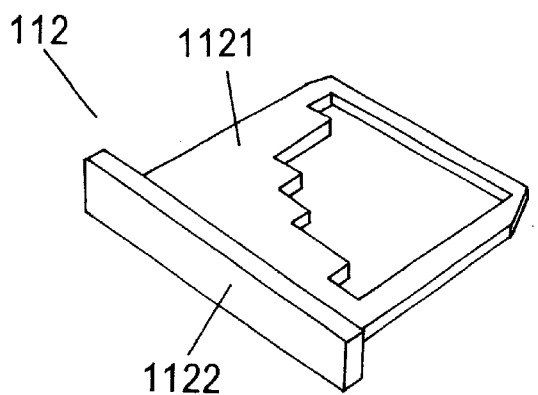
FIG. 12A shows an appearance of a mask material in accordance with a third exemplary embodiment of the present invention.
Figure 12B:
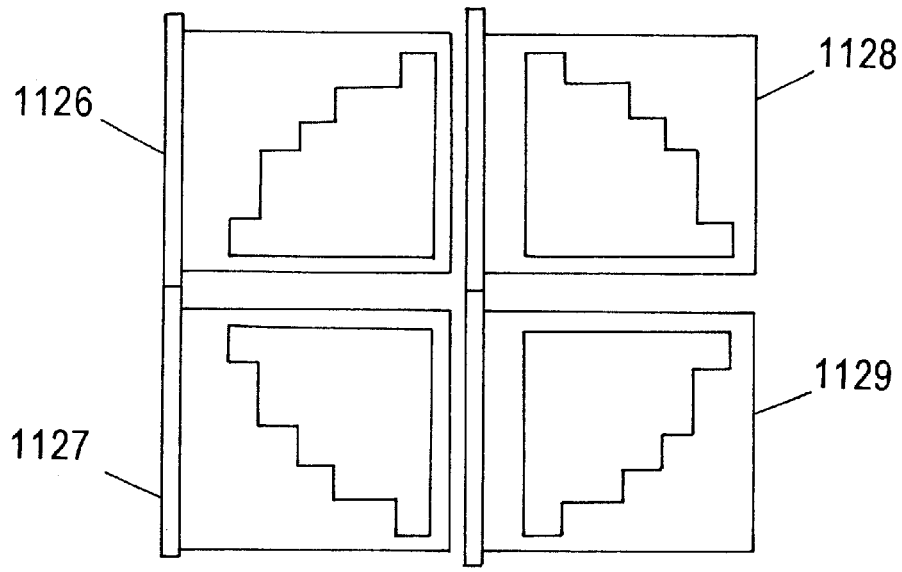
FIG. 12B is a plan view of the same.
Figure 12C:
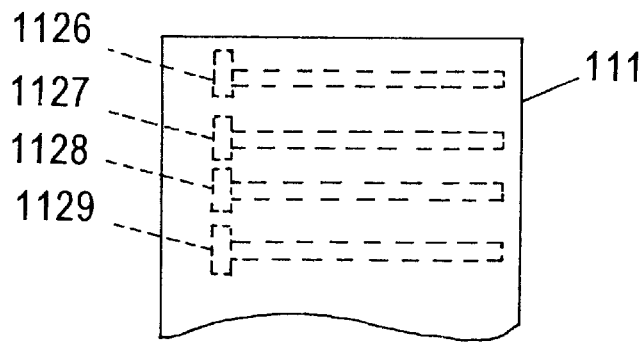
FIG. 12C is a side view of a mask exchange part in accordance with a third exemplary embodiment of the present invention.

Mask material 112 is provided with plate part 1121 having a break-off part in a designated area as shown in FIG. 12A. In this exemplary, four pieces of mask materials each having break-off part with a different shape corresponding to each of divided blocks [1], [2], [3] and [4] shown in FIG. 4A are, prepared. Mask material 1126 used for mounting conductive balls on divided block [1] of wafer 4 is provided with plate part 1121 having a shape (hatched with broken lines) as shown in FIG. 10B in order to suck balls 10 only to a designated area's suction part 114 corresponding to semiconductor elements 41. The same construction is applied to other mask materials 1127, 1128 and 1129 used for mounting balls 10 on divided blocks [2], [3] and [4], respectively.

These four kinds of mask materials 1126, 1127, 1128 and 1129 are piled in mask stocker 111. Mask stocker 111 is made so that mask materials can be drawn out from or inserted into pick-up head 80 by mask exchanger (not shown). Mask stocker 111 can remove the attached mask material 112 to exchange with another mask material 112 by positioning pick-up head 80 to match with the position of mask stocker 111. Here, mask material 112 is a general term for the particular mask materials of 1126, 1127, 1128 and 1129.

A conductive ball mounting method in the ball mounting equipment in accordance with the third exemplary embodiment of the present invention is explained below, referring to FIGS. 13A–13E.

Figure 13A:
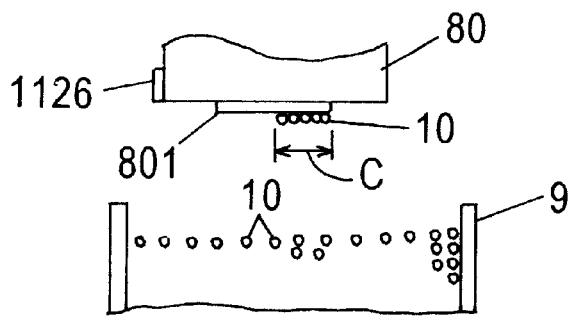
FIGS. 13A, 13B, 13C, 13D and 13E illustrate a process to mount conductive balls by the same equipment.
Figure 13B:
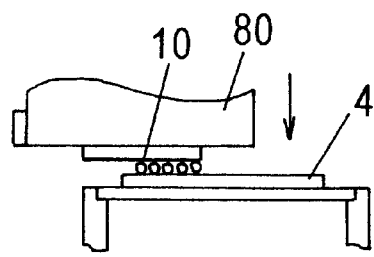
Figure 13C:
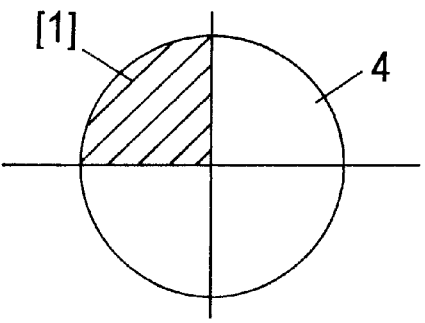
Figure 13D:
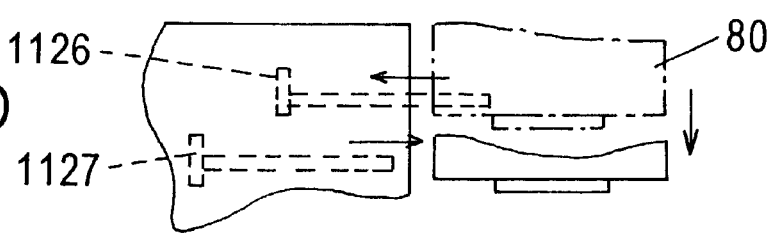
Figure 13E:
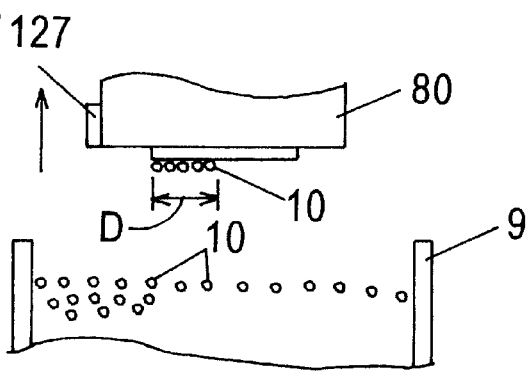

As shown in FIG. 13A, mask material 1126 corresponding to divided block [1] is attached to pick-up head 80. Pick-up head 80 is shifted downwards to conductive balls 10 stored inside ball supplier 9, and balls 10 are vacuum sucked by suction tool 801. At this time, fine suction holes 802 excluding designated area C of suction tool 801 are blocked by mask material 1126, and conductive balls 10 are sucked only to the unblocked suction area 114 corresponding to semiconductor elements 41 in divided block [1].

Then, pick-up head 80 is shifted upwards, moved to be above wafer 4, positioned to be matched with a designated part of wafer 4, brought downwards to mount balls 10 on each electrodes 42 (FIG. 3B) of respective semiconductor element 41 belonging to divided block [1] of wafer 4.

After the action described above, pick-up head 80 is moved upwards, shifted to mask stocker 111, positioned to the designated place. Mask material 1126 is released from its fixed position and stocked at the designated stock place of mask stocker 111.

Then, pick-up head 80 is shifted to position for attaching mask material 1127 corresponding to divided block [2] to pick-up head 80 from the side of it for the next mounting action.

Pick-up head 80 mounting mask material 1127 is shifted to position above ball supplier 9 and sucks balls 10 only to the designated area D of the bottom face of suction tool 801 by shifting downwards then upwards. In the same manner, balls 10 are mounted on each electrode 42 of semiconductor element 41 belonging to divided block [2] of wafer 4. By repeating the above action four times in total, balls 10 can be mounted on each electrode of all semiconductor elements 41 of wafer 4.

As said, in this exemplary, the number of trips of mounting head 7 can be only four times to complete the mounting task, which results in achieving good ball-mounting efficiency compared with a conventional ball-by-ball mounting method. In this third exemplary embodiment of the present invention, the equipment cost can be reduced because suction tool 801 which is expensive to make does not need to be exchanged and only mask material 112 which can be made easily at low cost is exchanged. A ball mounting can be stable and has less poor mounting rate because the size of the divided block is designed to be an appropriate size considering the past experiences. In other words, the objective, which has been difficult to realize by a conventional method, realizing both the good mounting efficiency and the stable mounting quality, can be achieved by the method in the present invention.

As an example of a substrate for mounting conductive balls on, the wafer on which semiconductor elements are formed is shown in the first and second exemplary embodiments, however, it is not restricted. The wafer can be, for example, a substrate on which a plurality of other electronic components is formed in a lattice arrangement. In this case, conductive balls are mounted on each electrode of the electronic components.

Thus, according to the present invention, the balls are sucked and picked up limiting only to the suction part in the designated area of each block determined by a suction limiter realizing that ball mounting on a block can be completed with one mounting action. Therefore, mounting conductive balls can be achieved effectively and stably even on a substrate having a specific part on which no balls do not need to be mounted with one single suction tool.

Further, in the present invention, because of a blockade plate attached to the attachment opening at the side face of the pick-up head for partially blocking the suction holes according to the ball mounting area, the conductive balls are sucked only to the fine suction holes corresponding to a designated ball mounting area, and can be stably mounted on any different ball mounting area by a single pick-up head.

What is claimed is:

1. A conductive ball mounting method for mounting conductive balls on electrodes formed in conjunction with a plurality of electronic components formed on a substrate by using a suction tool, wherein:

said suction tool having a suction surface, said suction surface covering one of a plurality of divided blocks of said substrate, each of said divided blocks representing a portion of said substrate, said suction tool further including a suction part formed on said suction surface, said suction part being operative for picking up the conductive balls in a position corresponding to said electrodes;

said conductive balls being picked up by said suction part are limited by a suction limiter to only the portion of the suction part corresponding to the electrodes in a given one of said divided blocks of said substrate on which said conductive balls are to be deposited, when said conductive balls are picked up by said suction tool; and said conductive balls picked up by said suction tool being deposited on said given one of said divided blocks of said substrate at the same time.

2. A conductive ball mounting method as recited in claim 1, wherein:

said suction part comprises a plurality of fine suction holes for picking up the conductive balls by vacuum suction;

said suction limiter comprising a fine suction hole blocker for blocking a portion of the fine suction holes of the suction part such that only the portion of the suction part corresponding to the electrodes in said given one of said divided blocks of said substrate pick-up conductive balls.

3. A conductive ball mounting method as recited in claim 2, wherein:

said fine suction hole blocker blocks the fine suction holes by covering an outside surface of said suction part.

4. A conductive ball mounting method as recited in claim 2, wherein:

said fine suction hole blocker blocks the fine suction holes by covering a surface of said suction part other than the surface contacting the conductive balls.

5. A conductive ball mounting method as recited in claim 1, wherein:

said suction part comprises a plurality of charged parts for attracting the conductive balls by static electricity;

said suction limiter comprises a controller for releasing a charge applied to said charged part such that only the portion of the suction part corresponding to the electrodes in said given one of said divided blocks of said substrate pick-up conductive balls.

6. A conductive ball mounting method for picking up conductive balls by vacuum suction using a suction tool and mounting the conductive balls on a workpiece, wherein:

the conductive balls are mounted, on different conductive ball mounting areas contained on said workpiece using a single suction tool for picking up said conductive balls and partially blocking a plurality of fine suction holes formed in said suction tool utilizing a fine suction hole blocker such that said blocked fine suction holes do not pickup up conductive balls.

7. A conductive ball mounting method as recited in claim 6, wherein:

said fine suction hole blocker blocks the fine suction holes from a side of a suction surface contacting the conductive balls.

8. A conductive ball mounting method as recited in claim 6, wherein:

said fine suction hole blocker blocks the fine suction holes from an opposite side of a suction surface contacting the conductive balls.

9. A conductive ball mounting method for picking up conductive balls by vacuum suction using a pick-up head having a bottom face on which a plurality of fine suction holes are formed and mounting the conductive balls on a workpiece, wherein:

the conductive balls are transferred to a mounting area on said workpiece by said pick-up head, said pick-up head having an opening for receiving a blockade plate for partially blocking said plurality of fine suction holes such that said blocked fine suction holes do not pick-up conductive balls, said blockade plate inserted into said pick-up head through an opening provided at a side face of said pick-up head.

10. A method for mounting conductive balls on electronic components formed on a substrate utilizing a pick-up apparatus for receiving said conductive balls and transferring said conductive balls to a desired position on said substrate, said pick-up apparatus comprising a surface having a plurality of receiving areas each of which is capable of receiving a conductive ball, said method comprising the steps of:

defining a portion of said substrate on which said conductive balls are to be deposited;

determining the locations in said portion of said substrate on which said conductive balls are to be deposited;

determining which of said receiving areas on said surface of said pick-up apparatus correspond to said locations in said portion of said substrate which are to receive a conductive ball; and preventing a receiving area on said surface of said pick-up apparatus not corresponding to a location in said portion of said substrate which is to receive a conductive ball from picking-up a conductive ball.

11. The method of claim 10, wherein said pick-up apparatus utilizes a suction force to pick-up a conductive ball.

12. The method of claim 11, wherein each of said receiving areas comprises a suction hole.

13. The method of claim 10, wherein said pick-up apparatus utilizes an electrostatic force to pick-up a conductive ball.

14. The method of claim 10, wherein the size of said surface of said pick-up apparatus having a plurality of receiving areas is less than the size of the substrate.

15. The method of claim 11, wherein said step of preventing said receiving area from picking up a conductive ball includes providing a mask over said receiving area.

16. The method of claim 13, wherein said step of preventing said receiving area from picking up a conductive ball includes controlling an electric charge supplied to said receiving area.

* * * * *